United States Patent [19]

Kim

[11] Patent Number: 5,081,060
[45] Date of Patent: Jan. 14, 1992

[54] METHOD FOR FORMING A CONNECTION DEVICE IN A SEMICONDUCTOR DEVICE

[75] Inventor: Jae K. Kim, Seoul, Rep. of Korea

[73] Assignee: Hyundai Electronics Industries, Co., Ltd., Kyungki, Rep. of Korea

[21] Appl. No.: 520,096

[22] Filed: May 7, 1990

[30] Foreign Application Priority Data

May 13, 1989 [KR] Rep. of Korea ............... 89-6394

[51] Int. Cl.$^5$ ................ H01L 21/72; H01L 21/441
[52] U.S. Cl. ............................. 437/52; 437/189; 437/978; 148/DIG. 141
[58] Field of Search ............... 437/41, 40, 913, 195, 437/52, 42, 44, 978, 189; 148/DIG. 141

[56] References Cited

U.S. PATENT DOCUMENTS

| | | |
|---|---|---|
| 4,114,256 | 9/1978 | Thibault et al. ............... 437/41 |
| 4,686,000 | 8/1987 | Heath ............................ 437/40 |
| 4,852,062 | 7/1989 | Baker et al. .................. 365/185 |

FOREIGN PATENT DOCUMENTS 0002654  1/1981  Japan ........................ 437/195

*Primary Examiner*—Brian E. Hearn
*Assistant Examiner*—C. Chaudhari
*Attorney, Agent, or Firm*—Merchant, Gould, Smith, Edell, Welter & Schmidt

[57] ABSTRACT

A method for electrically connecting a bit line to a source electrode of the MOSFETs in a semiconductor device is disclosed and which comprises arranging a gate electrode mask to form gate electrodes which are spaced apart and formed on respective gate oxide layers such that a contact mask which when positioned within the space between the gate electrodes provides a gap, for mask misalignment and critical dimension loss during the contact mask patterning process, of less than about 0.3 micrometer, separating each gate electrode from the respective proximate side of the contact mask. A contact hole having a side wall is formed to expose the source electrode by utilizing the contact mask and etching a portion of the etch stop layer and a portion of the insulating layer above the source electrode by the contact mask patterning process. A second insulating layer is deposited over the entire surface of the device. The etch stop layer and the second insulating layer are removed from the surface of the device except for a portion of the second insulating layer deposited on the sidewall of the contact hole to provide an insulating film spacer on the sidewall of the contact hole to ensure electrical isolation of the gate electrode proximate the sidewall of the contact hole. A conductive layer for a bit line is deposited on the entire surface of the device to electrically connect the source electrode to the bit line.

4 Claims, 4 Drawing Sheets

METHOD FOR FORMING A CONNECTION DEVICE IN A SEMICONDUCTOR DEVICE

BACKGROUND OF THE INVENTION

1. Field of the Invention

This invention relates to a method for forming a connection device of highly integrated semiconductor device, and more particularly to, a method for forming a connection device of highly integrated semiconductor device in which when one conductive material layer is selectively connected to another conductive material layer which is positioned on the one conductive layer or below the one conductive layer, a portion of an insulating layer formed on the underlying conductive material layer is etched to form a contact hole, and the conductive material layers are electrically connected by depositing a conductive material layer on the entire surface after forming insulating film spacers on the side wall of the contact hole to insulate the conductive material layers from the other electrode, thereby reducing the area of cell of semiconductor device.

Generally, in manufacturing an integrated circuit semiconductor device, in order to electrically connect a conductive material layer to another conductive material layer underlying the one conductive material layer, a portion of an insulating layer formed between the one conductive material layer and the another conducive material layer is etched to form a contact hole through which an electrical connection is accomplished. Regions where such a contact hole is formed are, for example, on a diffusion region in the silicon substrate, on a gate electrode and on a conductive material layer for internal connection line.

In order to form the contact hole in such regions, a plurality of mask patterning process steps must be performed utilizing a mask for patterning the conductive material layer to be electrically connected, a contact mask for forming a contact hole and a mask for patterning the conductive material layer deposited in the contact hole. The alignment of such masks must be performed in accordance with design rules for a semiconductor device.

2. Information Disclosure Statement

In the prior art a contact hole is obtained by etching a portion of an insulating layer formed on a conductive material layer to be contacted by lithographic etching technology. If a connection device for a semiconductor device is formed utilizing the prior art method for forming the contact hole, the alignment for each mask must be designed as described above.

Figure 1:
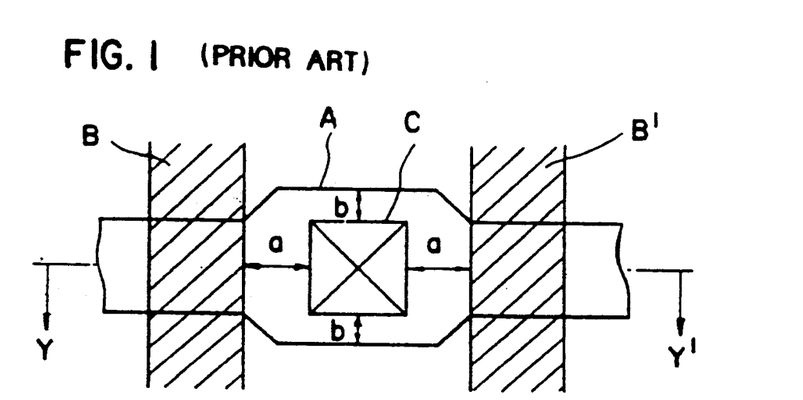
FIG. 1A illustrates a layout of the top view of mask layers when a bit line contact process according to the prior art method is performed in the semiconductor device.
FIG. 1B illustrates a cross-section of the semiconductor device of FIG. 1A taken along the line Y—Y'.

For example, as illustrated in FIG. 1A and 1B, in order to form a connection device for a semiconductor device to electrically connect a bit line 8A to MOSFET 20A, 20B, when a contact hole is formed on a source electrode 4 of MOSFET 20A, 20B, the width "w" between the contact mask C and gate electrodes 3A, 3B which are located proximate both ends of the source electrode 4 must be as long as the distance which must be maintained considering a thickness of insulating layer 5 to insulate the bit line 8A from the gate electrodes 3A and 3B, a minimum misalignment tolerance required for mask patterning process and a critical dimension loss occurred during the lithographic etching process. Otherwise, a current leakage may occur or it may cause a short circuit between the bit line 8A and the gate electrodes 3A, 3B, thereby resulting in the failure of the semiconductor device, or since the thickness of the insulating layer between the gate electrode 3A, 3B and the bit line 8A becomes thin, the insulating layer may be broken down during the operation of the semiconductor device, so that the semiconductor device may not be operated.

Figure 4A:
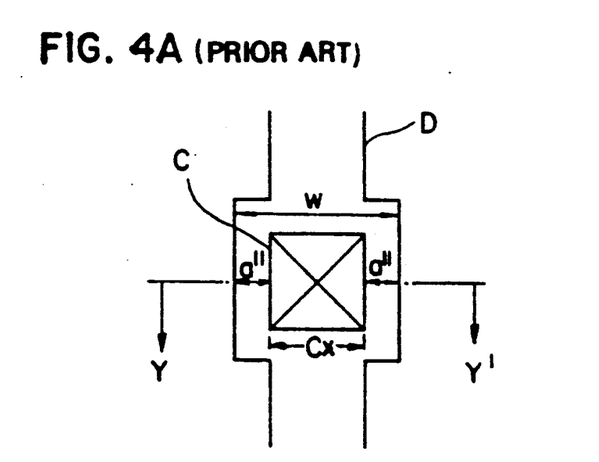
FIG. 4A illustrates a layout of the top view of mask layers when the contact mask patterning process according to the prior art method is performed on the internal connection line in the semiconductor device.
Figure 4B:
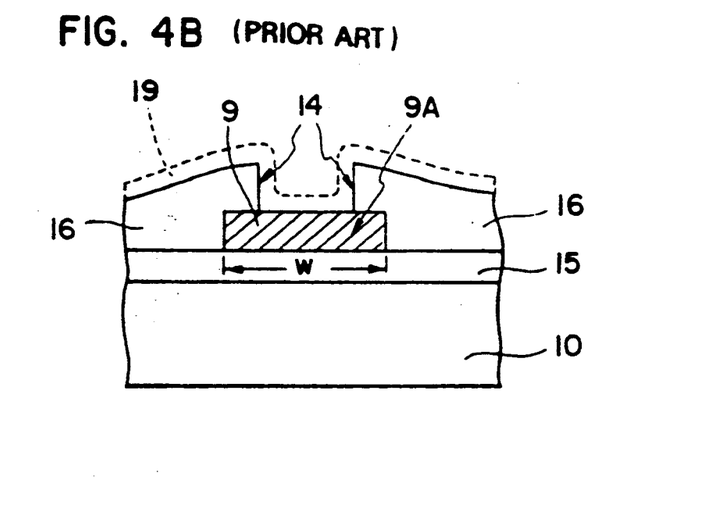
FIG. 4B illustrates a cross-section of the semiconductor device of FIG. 4A taken along the line Y—Y'.

Also, as illustrated in FIG. 4A and 4B, if a connection device for semiconductor device is made by forming a contact hole 14 on an internal connection line 9A which connects device to device, the width "w" of the internal connection line 9A must be maintained as long as the distance which should be retained considering a width Cx of the contact mask C, the mask misalignment tolerance and the critical dimension loss, that is, at least Cx+2a is needed, wherein Cx is the width of the contact mask C and "a" is the misalignment tolerance and the critical dimension loss. As described above, when the contact hole 14 is formed according to the prior art method, the width "w" of the internal connection line 9A positioned where the contact hole is formed should be larger than the width Cx of the contact mask C, so the integrity of semiconductor device decreases.

Accordingly, it is an object of the present invention to solve the problems presented in the prior art method for forming the connection device for semiconductor device, and to provide a method for forming a connection device for a semiconductor device, which comprises forming insulating film spacers on the side walls of contact hole after the contact hole is formed on a portion of an insulating layer formed on one conductive material layer, and depositing another conductive material layer to be electrically connected to the one conductive material layer on the entire surface.

SUMMARY OF THE INVENTION

One embodiment of the present invention may be summarized as a method for electrically connecting a bit line to a source electrode in a semiconductor device. The method comprises sequentially depositing a gate oxide film and a conductive material layer for gate electrodes on a silicon substrate. The gate electrode mask is then positioned on the surface of the conductive material layer to form gate electrodes which are spaced apart and formed on respective gate oxide layers such that when a contact mask is positioned within the space between the gate electrodes a predetermined distance or gap separating each gate electrode from each respective proximate side of the contact mask remains for mask misalignment and critical dimension loss during the contact mask patterning process. Each gap is less than about 0.3 micrometer. The gate oxide films and gate electrodes are formed by the mask patterning process of the gate oxide film and the conductive material layer utilizing the gate electrode mask. A source electrode is formed in the silicon substrate positioned between the gate electrodes. A drain electrode is formed in the silicon substrate and is operatively positioned proximate each gate electrode to provide a MOSFET. An insulating layer is deposited on the resulting entire surface and planarized. An etch stop layer is formed on the resulting entire surface. A contact hole having a side wall is formed by utilizing the contact mask and the contact mask patterning process and etching a portion of the etch stop layer and a portion of the insulating layer above the source electrode to expose the source electrode. A second insulating layer is then deposited over the resulting entire surface. The etch stop layer and the second insulating layer are removed from the surface except for a portion of the second insulating layer deposited on the sidewall of the contact hole. This step departs from the prior art by providing an insulating film spacer on the sidewall of the contact hole formed of the second insulating layer to ensure electrical isolation of the gate electrode proximate the sidewall of the contact hole. A conductive layer for a bit line is then deposited on the entire surface to electrically connect the source electrode to the bit line. The present invention includes the resulting semiconductor device produced by the above described method of the present invention.

A further embodiment of the present invention, is characterized in that it comprises the steps of forming a first insulating layer on a silicon substrate and then forming a first conductive material layer for internal connection line on the first conductive material layer. An internal connection line mask is arranged on the first conductive material layer with the same width as that of a contact mask which is utilized to form a contact hole in order to reduce the width of an internal connection line, and the internal connection line is formed by a mask patterning process of the conductive material layer. A second insulating layer is formed on the entire surface. A contact hole having side walls is formed by etching a portion of the second insulating layer on the internal connection line with a contact mask pattering process, thereby exposing the top surface of the internal connection line. An insulating film is formed on the entire surface. Insulating film spacers are formed on the side walls of the contact hole by anisotropically etching the insulating film. A second conductive material layer is deposited on the entire surface including the exposed surface of internal connection line, thereby electrically the second conductive material layer to the reduced internal connection line.

Figure 2:
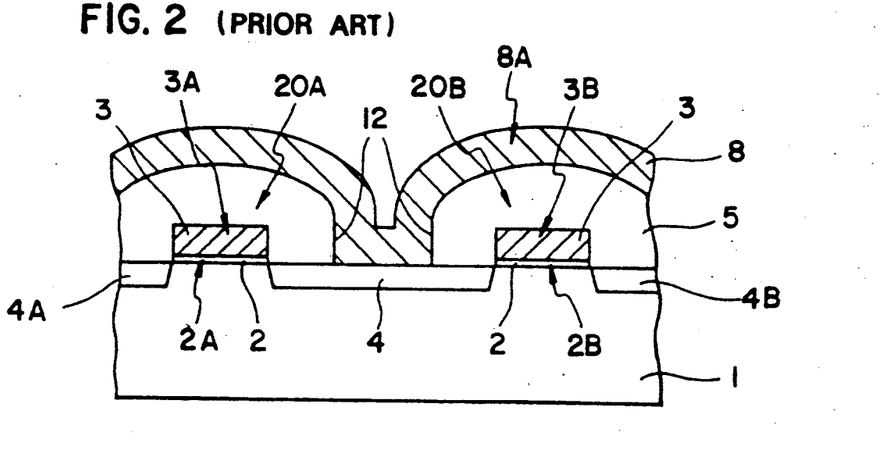
FIG. 2 illustrates a layout of the top view of mask layers when a bit line contact process according to the present invention is performed in the semiconductor device.
Figure 3:
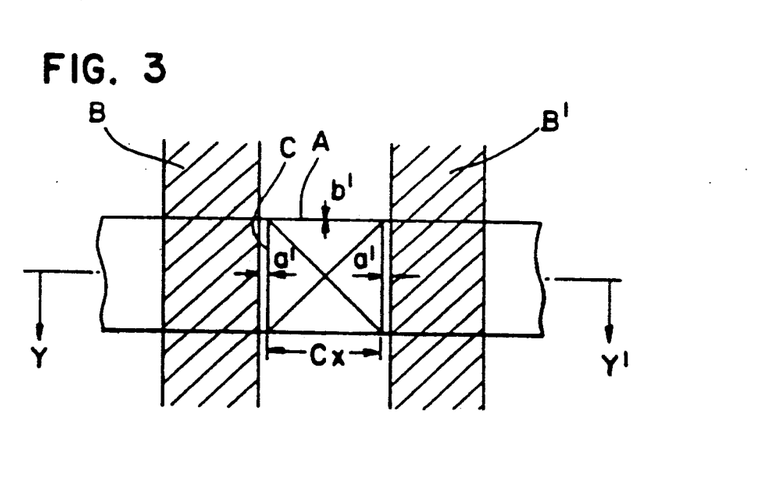
FIG. 3A through 3E illustrate cross-sections of the semiconductor device of FIG. 2 taken along the line Y—Y' which are useful to explain the process steps according to the present invention.
Figure 3A:
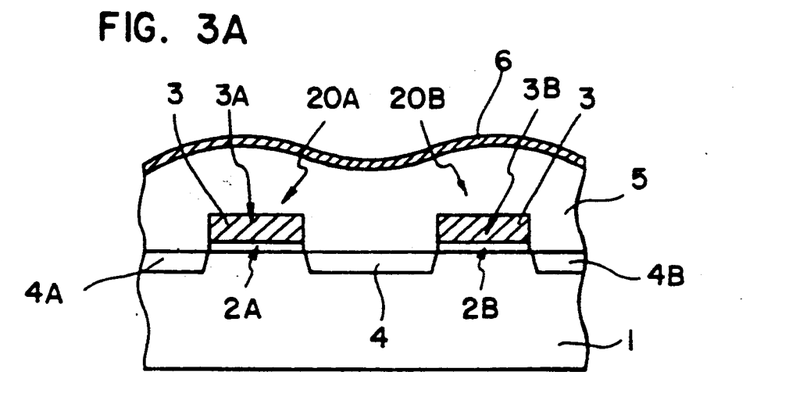
Figure 3B:
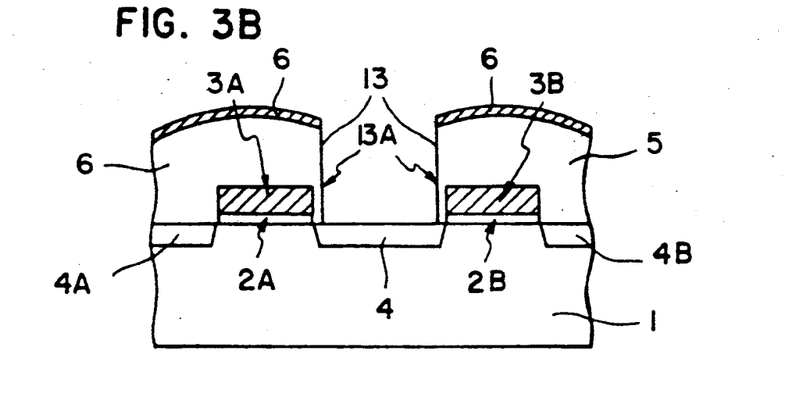
Figure 3C:
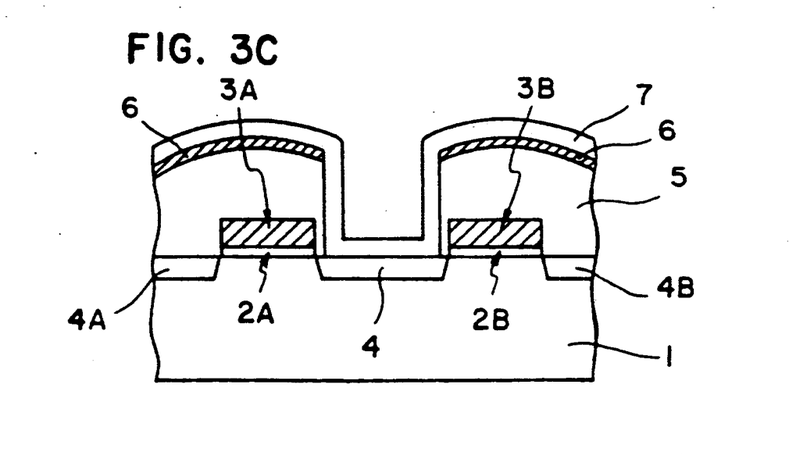
Figure 3D:
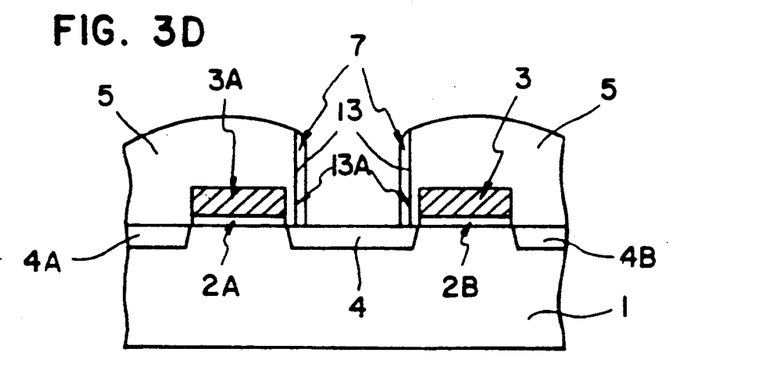
Figure 3E:
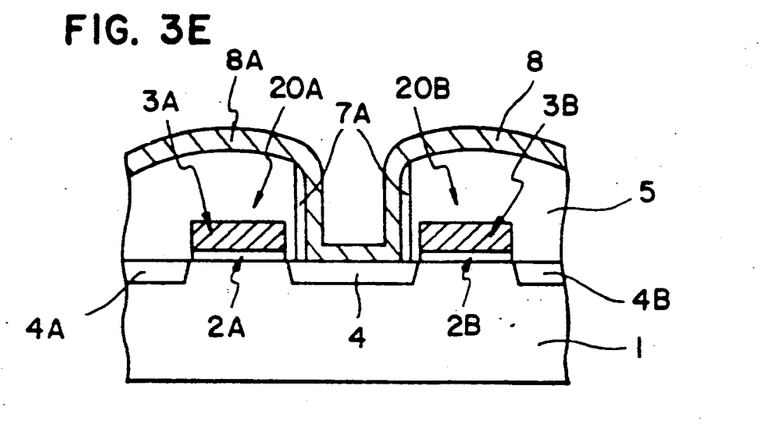

According to the present invention, if the connection device for a semiconductor device is made by the bit line contact process, as illustrated in FIG. 2 and 3E, the distance between the gate electrodes located proximate both ends of the source electrode is the same as the distance which should be maintained considering a minimum mask misalignment tolerance and a critical dimension loss 2a' plus the width Cx of the contact mask C. Also, since the electrical insulation between the bit line and the gate electrode is achieved by the insulating film spacers formed on the side wall of the contact hole, there is no need to form an insulating layer for electrical insulation therebetween, thereby resulting in the decrease of distance between the gate electrodes as much as the thickness of the insulating layer as compared to the prior art method.

Figure 5A:
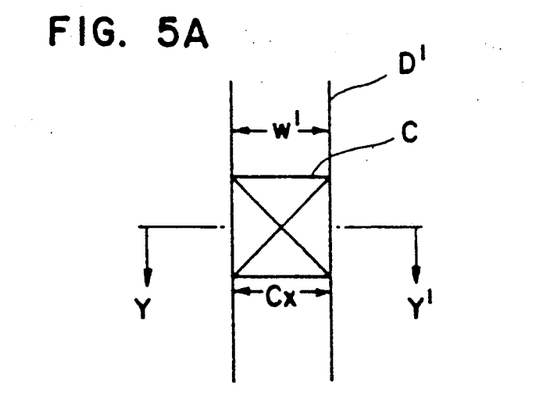
FIG. 5A illustrates a layout of the top view of mask layers when the contact mask patterning process according to the present invention is performed on the internal connection line in the semiconductor device.
Figure 5B:
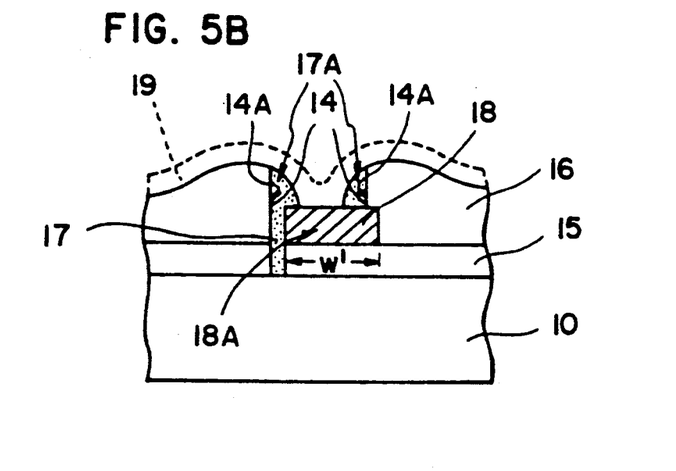
FIG. 5B illustrates a cross-section of semiconductor device of FIG. 5A taken along the line Y—Y'.

Furthermore according to the present invention, if the connection device for a semiconductor device is made by the contact process on the internal connection line which connects device to device, as illustrated in FIG. 5A, 5B, the width "w'" of the internal connection line is substantially the same as the width Cx of the contact mask C. By the way, when the insulating layer is etched to form the contact hole, the contact hole is likely to be formed out of the correct position due to the misalignment of the contact mask and the critical dimension loss and hence, a portion of the insulating layer proximate either side of the internal connection line is etched away, thereby exposing the surface of the silicon substrate.

However, according to the present invention, even though a portion of the insulating layer proximate either side of the internal connection line is etched away and a portion of the surface of the silicon substrate is exposed, the electrical insulation between the silicon substrate and the conductive material layer is achieved by insulating film spacers formed on the side walls of the contact hole, thereby avoiding undesired electrical connection therebetween.

BRIEF DESCRIPTION OF THE DRAWINGS

For fuller understanding of the nature and objects of the invention, reference should be made to the following detailed description taken in conjunction with the accompanying drawings in which.

DETAILED DESCRIPTION OF THE DRAWINGS

FIG. 1A illustrates a layout of the top view of mask layers when a bit line contact process according to the prior art method is performed in the semiconductor device.

When an active mask A, gate electrode masks B, B' and a contact mask C are positioned in accordance with the design rule mentioned above, a distance "a" between the right side of the gate electrode mask B and the left side of the contact mask C, another distance "a" between the right sides of the contact mask C and the left side of the gate electrode mask B' must be retained for the thickness of the insulating layer, the minimum mask misalignment tolerance and critical dimension loss and, a distance "b" between the top side of the active mask A and the top side of the contact mask C, and another distance "b" between the bottom side of the contact mask C and the bottom side of the active mask A must be retained for the minimum mask misalignment tolerance and a critical dimension loss.

FIG. 1B illustrates a cross-section of the semiconductor device of FIG. 1A taken along the line Y—Y'.

In the structure illustrated in FIG. 1B, a gate oxide film 2 and a conductive material layer 3 for gate electrode are sequentially deposited on a silicon substrate 1. Gate oxide films 2A, 2B and gate electrodes 3A, 3B are formed by a mask patterning process of the conductive material layer 3 and the gate oxide film 2. Then, a source electrode 4 is formed in the portion of the silicon substrate 1 which is positioned between the gate electrodes 3A, 3B, and drain electrodes 4A, 4B are formed in the silicon substrate 1 proximate the outer ends of the respective gate electrodes 3A, 3B by the ion implantation. An insulating layer 5 is then deposited on the entire surface. As result of this, MOSFET 20A, 20B are obtained. Then, a contact hole 12 for contacting the bit line is formed on a portion of the source electrode 4 by the contact mask patterning process of the insulating layer 5, and a conductive material layer 8 for bit line is deposited on the entire surface, thereby electrically connecting a bit line 8A to the source electrode 4 of MOSFET 20A, 20B.

As can be seen from the above description, according to the prior art, the area of the source electrode 4 connected to the bit line 8A becomes wider due to the distance "a" and the distance "b" which are required for the mask patterning process, as described in connection with FIG. 1A.

FIG. 2 illustrates a layout of the top view of mask layers when the bit line contact process according to the present invention is performed in the semiconductor device.

When an active mask A', gate electrode masks B, B' and a contact mask C are positioned in accordance with the design rule as illustrated in FIG. 2, only a distance a' between the right side of the gate electrode mask B and the left side of the contact mask C, and another distance "a'" between the right side of the contact mask C and the right side of the gate electrode mask B' are retained for the mask misalignment tolerance and a critical dimension loss, and the distance "b'" for the top side of the contact mask C is not considered, so that the top side of the contact mask substantially coincides with that of the active mask A'.

FIG. 3A through 3E illustrate cross-sections of the semiconductor device of FIG. 2 taken along the line Y—Y' which are useful to explain the process steps according to the present invention in order to reduce the area of cell of semiconductor device.

Referring to FIG. 3A, a gate oxide film 2 and a conductive material layer 3 for gate electrode are sequentially deposited on a silicon substrate 1. As illustrated in FIG. 2, gate electrode masks B, B' are arranged with the distance comprising the width Cx of contact mask C for forming a contact hole and the distance "a'" for each side of the contact mask, wherein the distance "a'" is required for the mask misalignment tolerance and a critical dimension loss during the contact mask patterning process. Gate oxide films 2A, 2B and gate electrodes 3A, 3B are formed by the mask patterning process of the gate oxide film 2 and the conductive material layer 3 for gate electrode using the arranged gate electrode mask B, B'. Then, a source electrode 4 is formed in the portion of the silicon substrate 1 which is positioned between the gate electrodes 3A, 3B. Drain electrodes 4A, 4B are formed in the silicon substrate 1 proximate the outer ends of the respective gate electrodes 3A, 3B by ion implantation. An insulating layer 5 is deposited on the entire surface and is planarized. A contact hole 13 is formed by etching a portion of the insulating layer 5 on the source electrode 4 with the contact mask patterning process. When insulating spacers 7A of oxide film 7, which will be described in conjunction with FIG. 3C and 3D, is formed on the side walls 13A of the contact hole 13, an etch stop layer 6, is deposited on the entire surface. Preferably, the insulating layer 5 is PSG (Phosphor - Silicate - Glass) or BPSG (Boro - Phosphor - Silicate - Glass) and an etch stop layer 6 is a nitride film.

FIG. 3B illustrates a cross section of a semiconductor device in which, in order to form a contact hole, a portion of the insulating layer 5 and the etch stop layer 6 are sequentially etched by the contact mask patterning process utilizing the contact mask C illustrated in FIG. 2, thereby exposing the top surface of the source electrode 4.

FIG. 3C illustrates a cross section of the semiconductor device in which an insulating layer 7, for example, an oxide film, is deposited on the entire surface of the structure illustrated FIG. 3B to form insulating film spacers on the side wall 13A of the contact hole 13.

FIG. 3D illustrates a cross section of a semiconductor device in which insulating film spacers 7A for electrical insulation are formed by etching the insulating layer 7 with the anisotropic etching process. Here, during the insulating layer 7, for example, an oxide film, is etched to form the insulating film spacer 7A, the nitride film used as the etch stop layer 6 protect the insulating layer 5 from being etched away. Then, the nitride film of the etch stop layer 6 is removed. However, it should be noted that the nitride film may be retained.

FIG. 3E illustrates a cross section of a semiconductor device in which a conductive material layer 8 used for bit line is deposited on the entire surface of the structure illustrated in FIG. 3D, to electrically connect the source electrode 4 of MOSFET 20A, 20B to a bit line 8A.

As described above, according to the present invention, the area of the source electrode 4 to which the bit line 8A is connected can be decreased significantly, in comparison with the prior art semiconductor device, by arranging the gate masks B, B' for the gate electrodes 3A, 3B, and contact mask C for the contact hole 13 with the distances as illustrated in FIG. 2.

In the prior art semiconductor device shown in FIG. 1B, since the insulating layer 5 is required for electrical insulation between the bit line 8A and the gate electrodes 3A, 3B, twice as much area as thickness of the insulating layer 5 in the semiconductor device is needed.

However, in the semiconductor device manufactured by the method according to the present invention, since the insulating layer 5 for electrical insulation between the gate electrodes 3A, 3B and the bit line 8A can be omitted and the insulating film spacers 7A for insulation therebetween are formed on the side wall 13A of the contact hole 13, the area of the source electrode can be reduced.

In the semiconductor device manufactured by employing the bit line contact process, the specific comparison between the area of the source electrode of the semiconductor device according to the present invention and that of the source electrode of the semiconductor according to the prior art follow:

First, in FIG. 1A illustrating a layout of the top view of mask layers during the bit line contact process according to the prior art, each distance a between the respective sides of contact mask C and the gate electrode masks B, B' assumes the thickness, 0.3 micrometer, of the insulating layer 5 for electrical insulation between the bit line and the gate electrodes, the mask misalignment tolerance, 0.2 micrometer and the critical dimension loss, 0.1 micrometer. Thus, each distance "a" between the respective sides of contact mask C and the gate electrode masks B, B', respectively, is 0.6 micrometer. Each distance "b" between the respective top side and the bottom side of the contact mask C and the top and bottom sides of the active mask A, respectively, includes the mask misalignment tolerance, 0.2 micrometer and the critical dimension loss, 0.3 micrometer.

On the other hand, in FIG. 2 illustrating a layout of the top view of mask layers during the bit line contact process according to the present invention, each distance "a'" between the respective sides of contact mask C and the gate electrode masks B, B', respectively, includes the mask misalignment tolerance, 0.2 micrometer and the critical dimension loss, 0.1 micrometer. Thus, the each distance "a'" between the respective sides of contact mask C and the gate electrode masks B, B', respectively, is 0.3 micrometer. Next, the distance "b'" between the respective sides of the contact mask C and the top and bottom sides of the active mask A', respectively, is retained zero.

Accordingly, if the area of the bit line contact mask is, for example, 0.8 micrometer×0.8 micrometer, the area S of the source electrode required in the prior art is as following:

$S$ = (0.8 micrometer × 0.6 micrometer × 2) ×

(0.8 micrometer + 0.3 micrometer × 2) = 2.8 square micrometer

However, the area S' of the source electrode according to the present invention is as following:

$S'$ = (0.8 micrometer × 0.3 micrometer × 2) × 0.8 micrometer = 1.12 square micrometer Therefore, it can be seen that the area S' of the source electrode according to the present invention substantially equals only 40% of the area S of the source electrode according to the prior art.

Next, it will be described how the present invention is utilized when a connection device for semiconductor device is made by forming a contact hold on an internal connection line for connecting device to device in the semiconductor device.

FIG. 4A illustrates a layout of the top view of mask layers when the contact patterning process according to the prior art method is performed on the conductive material layer 18 for internal connection line shown FIG. 4B. When a contact mask C is arranged in an internal connection line mask D, since each distance "a''''", which is required for the mask misalignment tolerance and the critical dimension loss, must be retained between the masks, the width "w" of the conductive material layer 18 for internal connection line should be wider than the width Cx of the contact mask C.

FIG. 4B illustrates a cross-section of semiconductor device of FIG. 4A taken along the line Y—Y'.

A first insulating layer 15 is deposited on a silicon substrate 10 and a first conductive material layer 9 for internal connection line is then deposited thereon. Then, the mask patterning process of the first conductive material layer 9 is performed utilizing the internal connection line mask D illustrated in FIG. 4A to form an internal connection line 9A having a width "w". After a second insulating layer 16 is deposited on the entire surface, a portion of the second insulating layer 16 on the internal connection line 9A is etched by the contact mask patterning process utilizing the contact mask C to form a contact hole 14, thereby resulting in exposure of a portion of the top surface of the internal connection line 9A. After that, a second conductive material layer 19 is deposited on the entire surface as illustrated in dotted line in FIG. 4B. As can be seen from FIG. 4A, 4B, according to the prior art, since the width "w" of the first conductive material layer 19 for internal connection line must be undesirably wider than the width Cx of the contact hole 14, it deteriorates the integrity of a semiconductor device.

FIG. 5A illustrates a layout of the top view of mask layers in which a contact mask C is arranged to have the same width Cx as the width "w'" of the internal connection line mask D in order to reduce the area of the semiconductor device illustrated in FIG. 4A by employing the principle of the present invention.

FIG. 5B illustrates a cross-section or the semiconductor device of FIG. 5A taken along the line Y—Y'.

A first insulating layer 15 is deposited on a silicon substrate 10 and a first conductive material layer 18 for internal connection line is then deposited thereon. Then, the mask patterning process of the first conductive material layer 18 is performed utilizing the internal connection line mask D' having the same width as that of contact mask C for forming a contact hole as illustrated in FIG. 5A to form an internal connection line 9A having a width "w'". After a second insulating layer 16 is deposited on the entire surface, a portion of the second insulating layer 16 on the internal connection line 18A is etched by the contact mask patterning process utilizing the contact mask C to form a contact hole 14, thereby resulting in exposure of a portion of the top surface of the internal connection line 18A. At this time, it is assumed that since the mask misalignment tolerance and the critical dimension loss for the etching process were not considered, a portion of the silicon substrate 10 is likely to be exposed by the etching performed to form the contact hole 14 due to the misalignment of mask. In order to compensate for this problem after an insulating film 17, for example, an oxide film, is deposited on the entire surface, insulating film spacers 17A are formed on the side wall 14A of the contact hole 14 by anisotropically etching the insulating film 17. A second conductive material layer 19 is deposited as illustrated in dotted line in FIG. 5B. It is preferable to arrange the masks such that the width Cx of the contact mask C coincides with the width "w'" of the internal connection line 18A in the contact mask patterning process. However, even though a portion of the first insulating layer 15 proximate either end of the internal connection line 18A is etched away due to the misalignment of the contact mask C, which results in a portion of the top surface of the silicon substrate 10 being exposed, according to the present invention, the internal connection line 18 A and the second conductive material layer 19 can be electrically insulated from the silicon substrate 10 by forming on the side wall 14A of the contact hole 14 the insulating film spacers 17A.

As described above, according to the present invention, after the contact hole is formed by the lithographic etching technology, the insulating film spacers are formed on the side walls of the contact hole. As a result, the size of the underlying conductive material layer to be contacted can be reduced effectively, so that the integrity of the semiconductor device increases.

The foregoing description of the preferred embodiment has been presented for the purpose of illustration and description. It is not intended to limit the scope of the invention. Many modifications and variations are possible in the light of the above teaching. It is intended that the scope of the invention be defined by the claims.

What is claimed is:

1. In a semiconductor device comprising a first insulating layer formed on a silicon substrate, an internal connection line formed on a portion of the first insulating layer and a second insulating layer formed on the entire surface, a method for forming a connection device for semiconductor device comprising forming a contact hole by etching a portion of the second insulating layer to expose a portion of the top surface of the internal connection line, the method further comprising the steps of:

forming a first insulating layer on a silicon substrate;
   forming a first conductive material layer for internal connection line on the first conductive material layer;
   arranging an internal connection line mask on the first conductive material layer with the same width as that of a contact mask which is utilized to form a contact hole in order to reduce the width of an internal connection line, and forming the internal connection line by a mask patterning process of the conductive material layer;
   forming a second insulating layer on the entire surface;
   forming a contact hole having side walls by etching a portion of the second insulating layer on the internal connection line with a contact mask patterning process, thereby exposing the top surface of the internal connection line;
   forming an insulating film on the entire surface, and forming insulating film spacers on the side walls of the contact hole by anisotropically etching the insulating film; and
   depositing a second conductive material layer on the entire surface including the exposed surface of internal connection line, thereby electrically the second conductive material layer to the reduced internal connection line.

2. The method of claim 1 wherein the insulating film for insulating film spacers is an oxide.

3. A method for electrically connecting a bit line to a source electrode of MOSFETs in a semiconductor device, the method comprising:

sequentially depositing a gate oxide film and a conductive material layer for gate electrodes on a silicon substrate;
   arranging a gate electrode mask to form gate electrodes which are spaced apart and formed on respective gate oxide layers such that a contact mask which when positioned within the space between the gate electrodes provides gap, for mask misalignment and critical dimension loss during the contact mask patterning process, of less than about 0.3 micrometer, separating each gate electrode from the respective proximate side of the contact mask;
   forming the gate oxide films and gate electrodes by the mask patterning process of the gate oxide film and the conductive material layer utilizing the gate electrode mask;
   forming a source electrode in the silicon substrate positioned between the gate electrodes;
   forming a drain electrode in the silicon substrate operatively positioned proximate each gate electrode to provide MOSFETs;
   depositing an insulating layer on the entire surface and planarizing the insulating layer;
   forming an etch stop layer on the entire surface;
   forming a contact hole having a side wall to expose the source electrode by utilizing the contact mask and etching a portion of the etch stop layer and a portion of the insulating layer above the source electrode by the contact mask patterning process;
   depositing a second insulating layer over the entire surface;
   removing the etch stop layer and the second insulating layer from the surface except for a portion of the second insulating layer deposited on the sidewall of the contact hole thereby providing an insulating film spacer on the sidewall of the contact hole to ensure electrical isolation of the gate electrode proximate the sidewall of the contact hole; and
   depositing a conductive layer for a bit line on the entire surface to electrically connect the source electrode to the bit line.

4. A semiconductor device produced by a process comprising the steps of:

sequentially depositing a gate oxide film and a conductive material layer for gate electrodes on a silicon substrate;
   arranging a gate electrode mask to form gate electrodes which are spaced apart and formed on respective gate oxide layers such that a contact mask which when positioned within the space between the gate electrodes provides gap, for mask misalignment and critical dimension loss during the contact mask patterning process, of less than about 0.3 micrometer, separating each gate electrode from the respective proximate side of the contact mask;
   forming the gate oxide films and gate electrodes by the mask patterning process of the gate oxide film and the conductive material layer utilizing the gate electrode mask;
   forming a source electrode in the silicon substrate positioned between the gate electrodes;
   forming a drain electrode in the silicon substrate operatively positioned proximate each gate electrode to provide MOSFETs;
   depositing an insulating layer on the entire surface and planarizing the insulating layer;
   forming an etch stop layer on the entire surface;
   forming a contact hole having a side wall to expose the source electrode by utilizing the contact mask and etching a portion of the etch stop layer an a portion of the insulating layer above the source electrode by the contact mask patterning process;
   depositing a second insulating layer over the entire surface;
   removing the etch stop layer and the second insulating layer from the surface except for a position of the second insulating layer deposited on the sidewall of the contact hole thereby providing an insulating film spacer on the sidewall of the contact hole to ensure electrical isolation of the gate electrode proximate the sidewall of the contact hole; and
   depositing a conductive layer for a bit line on the entire surface to electrically connect the source electrode to the bit line.

* * * * *

UNITED STATES PATENT AND TRADEMARK OFFICE
CERTIFICATE OF CORRECTION

PATENT NO. : 5,081,060

DATED : Jan. 14, 1992

INVENTOR(S) : Jae K. Kim

It is certified that error appears in the above-identified patent and that said Letters Patent is hereby corrected as shown below:

In column 1, line 28, please change "the another conducive" to read --another conductive--.

In column 3, line 27, please change "pattering" to --patterning--.

In column 5, line 29, please change "a'" to --"a'"--.

In column 6, line 16, after "illustrated" please insert --in--.

In column 6, line 60, please change "follow" to --as follows--.

In column 6, line 63, please change "a" to --"a"--.

In column 7, line 42, please change "hold" to --hole--.

In column 8, line 17, please change "or" to --of--.

UNITED STATES PATENT AND TRADEMARK OFFICE
CERTIFICATE OF CORRECTION

PATENT NO. : 5,081,060
DATED : Jan. 14, 1992
INVENTOR(S) : Jae K. Kim

It is certified that error appears in the above-indentified patent and that said Letters Patent is hereby corrected as shown below:

In column 9, line 32, please change "pattering" to --patterning--.

Signed and Sealed this

Twelfth Day of October, 1993

*Attest:*

BRUCE LEHMAN

*Attesting Officer*  *Commissioner of Patents and Trademarks*